US012663848B2

(12) United States Patent
Jenne et al.

(10) Patent No.: US 12,663,848 B2
(45) Date of Patent: Jun. 23, 2026

(54) SERVER SYSTEM POWER ASSIST SYSTEM

(71) Applicant: Dell Products L.P., Round Rock, TX (US)

(72) Inventors: John E. Jenne, Georgetown, TX (US); John J. Breen, Lampasas, TX (US)

(73) Assignee: Dell Products L.P., Round Rock, TX (US)

( * ) Notice: Subject to any disclaimer, the term of this patent is extended or adjusted under 35 U.S.C. 154(b) by 60 days.

(21) Appl. No.: 18/415,322

(22) Filed: Jan. 17, 2024

(65) Prior Publication Data

US 2025/0231604 A1      Jul. 17, 2025

(51) Int. Cl.
| G06F 1/26 | (2006.01) |
| G06F 1/30 | (2006.01) |
| H05K 7/14 | (2006.01) |

(52) U.S. Cl.
CPC .............. G06F 1/263 (2013.01); G06F 1/305 (2013.01); H05K 7/1492 (2013.01)

(58) Field of Classification Search
CPC ........ G06F 1/263; G06F 1/305; H05K 7/1492
See application file for complete search history.

(56) References Cited

U.S. PATENT DOCUMENTS

| 9,392,720 B1 * | 7/2016 | Kim ...................... H05K 7/1492 |
| 10,965,148 B1 * | 3/2021 | Wang .................... G06F 1/3287 |

| 11,097,633 B1 * | 8/2021 | Kohn ...................... B60L 58/12 |
| 11,360,531 B1 * | 6/2022 | Wang .................... H01M 10/48 |
| 11,868,191 B1 * | 1/2024 | Wang .................... G06F 1/266 |
| 2013/0093397 A1 * | 4/2013 | Chan .................. H01M 10/425 |
| | | 320/128 |
| 2013/0194726 A1 * | 8/2013 | Bailey ................. H05K 7/1489 |
| | | 361/637 |
| 2014/0232350 A1 * | 8/2014 | Chan ...................... G06F 1/188 |
| | | 320/134 |
| 2017/0222464 A1 * | 8/2017 | Pullen ................ H02M 3/1584 |
| 2019/0273366 A1 * | 9/2019 | Huang .................... H02B 1/48 |
| 2020/0135418 A1 * | 4/2020 | Zhou .................... H01H 13/023 |
| 2021/0021138 A1 * | 1/2021 | Yang ...................... G06F 1/263 |
| 2021/0298194 A1 * | 9/2021 | Zen-Ruffinen ....... H05K 7/1492 |
| 2021/0305814 A1 * | 9/2021 | Baby .......................... G06F 1/30 |
| 2021/0378132 A1 * | 12/2021 | Iyengar .............. H01M 10/659 |
| 2023/0057545 A1 * | 2/2023 | Gao .................. H05K 7/20781 |
| 2023/0187965 A1 * | 6/2023 | Hsu .......................... G06F 1/263 |
| | | 307/66 |
| 2024/0069611 A1 * | 2/2024 | Zhan .......................... G06F 1/30 |
| 2024/0114645 A1 * | 4/2024 | Nordin ..................... H01R 9/18 |
| 2025/0275079 A1 * | 8/2025 | Mentovich ............. G06F 1/183 |

* cited by examiner

*Primary Examiner* — Aurel Prifti
(74) *Attorney, Agent, or Firm* — Terrile, Cannatti & Chambers, LLP; Stephen A. Terrile

(57) ABSTRACT

A power assist system. The power assist system includes a power assist system housing; a power assist system power portion contained within the power assist system housing; and, a power assist system controller contained within the power assist system housing, the power assist system controller coupling the power assist system to a power transmittal device, the power assist system controller providing power from the power assist system power portion to the power transmittal device during a peak power event.

18 Claims, 7 Drawing Sheets

SERVER SYSTEM POWER ASSIST SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a server type information handling system with a power assist system.

In one embodiment, the invention relates to a power assist system comprising a power assist system housing; a power assist system power portion contained within the power assist system housing; and, a power assist system controller contained within the power assist system housing, the power assist system controller coupling the power assist system to a power transmittal device, the power assist system controller providing power from the power assist system power portion to the power transmittal device during a peak power event.

In another embodiment, the invention relates to a system comprising a processor, a data bus coupled to the processor; and, a power assist system comprising a power assist system housing; a power assist system power portion contained within the power assist system housing; and, a power assist system controller contained within the power assist system housing, the power assist system controller coupling the power assist system to a power transmittal device, the power assist system controller providing power from the power assist system power portion to the power transmittal device during a peak power event.

In another embodiment, the invention relates to a server rack system comprising: a server rack, a system installed on the server rack, the system comprising a processor; a data bus coupled to the processor; and, a power assist system installed on the server rack, the power assist system comprising a power assist system housing; a power assist system power portion contained within the power assist system housing; and, a power assist system controller contained within the power assist system housing, the power assist system controller coupling the power assist system to a power transmittal device, the power assist system controller providing power from the power assist system power portion to the power transmittal device during a peak power event.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
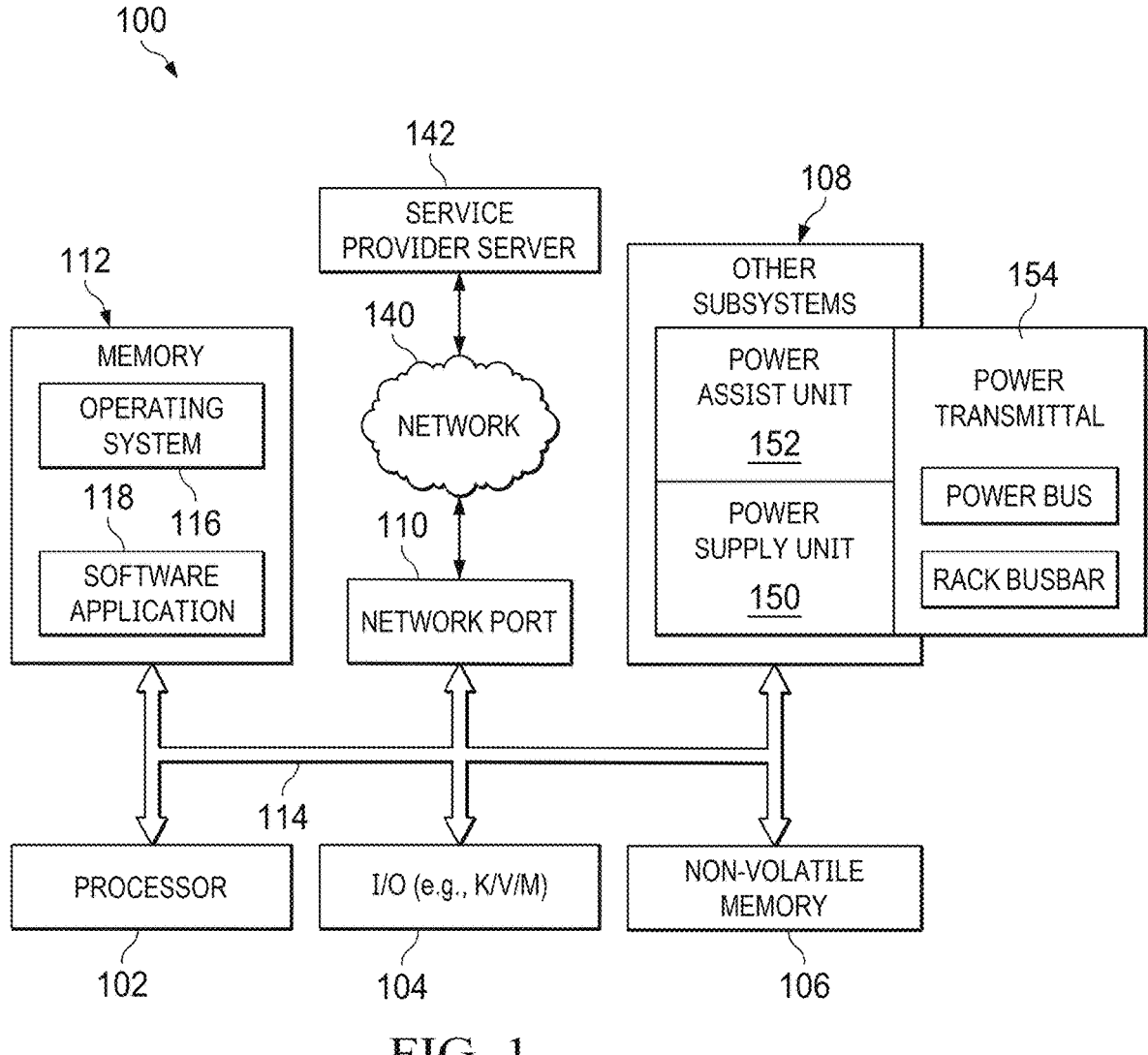
FIG. 1 shows a general illustration of components of an information handling system as implemented in the system and method of the present invention.

Various aspects of the disclosure include an appreciation that it is known to provide information handling systems with disaggregated power solutions. Various aspects of the disclosure include an appreciation that certain disaggregated power solution conform to power standards which include data center rack busbar based power schemes (such as open compute project open rack standard). Various aspects of the present disclosure include an appreciation that busbar based power schemes can require provision of power conforming to the busbar based power scheme.

Various aspects of the disclosure include an appreciation that certain known power solution standards, such as the open compute project (OCP) open rack power solution standard disaggregates power supply unit (PSU) devices and battery backup unit (BBUs) devices from specific server type information handling systems and consolidates these devices at the rack level. By being so disaggregated, individual server type information handling systems are not constrained to the mechanical space allocated within the server type information handling system. Various aspects of the disclosure include an appreciation that the additional mechanical volume enables various benefits such as higher capacity, higher efficiency, longer hold up time, and integrated automatic transfer switches (ATS).

Various aspects of the disclosure include an appreciation that in certain cases, central processing unit (CPU) and graphics processing unit (GPU) peak power requirements can exceed target power supply unit capacity. Various aspects of the disclosure include an appreciation that this condition can limits supported CPU and GPU configurations and can result in power supply unit sizing adjustments. Various aspects of the disclosure include an appreciation that certain platform configurations can require a higher capacity power supply unit based purely on CPU or GPU peak power. Various aspects of the disclosure include an appreciation that providing a higher capacity power supply unit, including increasing a quantity of power supply units can increase a capital expense associated with the server type information handling system and can also increases an operation expense associated with the server type information handling system due to lower operating efficiency.

Various aspects of the disclosure include an appreciation that peak power events can have an effect reflect on data center power distribution, potentially resulting in unexpected shutdown from over-current protection circuits tripping. Various aspects of the disclosure include an appreciation that repetitive peak power events can cause over-current protection thermistors to slowly heat up and trip despite peak power events staying within traditional circuit breaker curves.

Various aspects of the disclosure include an appreciation that when a storage class memory (SCM) requires a hardware flush of a CPU cache, the initial power requirements of the require hardware flush of CPU cache can exceed a software defined battery backup unit capability, thus limiting supported configurations with SCMs.

A system and method are disclosed for providing a server type information handing system with a power assist system. In certain embodiments, the additional mechanical volume enabled by a disaggregated power solution can be extended to provide support for power assist units (PAU). In certain embodiments, the power assist units include an appreciation that power assist units can include bulk capacitors which charge from and discharge to the vertical rack busbar. In certain embodiments, the power assist units support multiple usage models including extended peak power support, filtering peak power events from the data center, extended ride through time, or extended holdup time when transitioning to a BBU for persistent memory usage models.

In certain embodiments, the power assist system provides high output power capacitance via a power assist unit (PAU). In certain embodiments, the power assist unit includes a battery backup unit (BBU) type power assist unit which conforms to a battery backup unit form factor. In certain embodiments, the battery backup unit power assist unit is configured to be installed within a battery backup unit shelf of a server rack, a battery backup unit slot of a server type information handling system, or a combination thereof. In certain embodiments, the power assist unit includes a power supply unit (PSU) type power assist unit which conforms to a power supply unit form factor. In certain embodiments, the power supply unit power assist unit is configured to be installed within a power supply shelf of a server rack, a power supply slot of a server type information handling system, or a combination thereof. In certain embodiments, the power assist system conforms with power supply unit shelf behavior, battery backup unit shelf behavior, or a combination thereof defined by a server rack specification. In certain embodiments, the server rack specification includes an open rack base specification such as the ORv3 base specification.

In certain embodiments, the power assist system includes high voltage bulk capacitors such as those commonly found in power supply units. In certain embodiments, the power assist system senses a busbar voltage. In certain embodiments, the power assist system charges at nominal voltage via a boost controller. In certain embodiments, the power assist system discharges when a system voltage droops. In certain embodiments, the power assist system discharges via a buck controller. In certain embodiments, the buck controller controls a buck converter or a step down converter.

In certain embodiments, the power assist system includes a switched discharge resistor. In certain embodiments, the switched discharge resistor facilitates draining of the charge on the bulk capacitors when the power assist system is serviced. In certain embodiments, the power assist system operates at a busbar voltage below the power supply units in the power shelf and above the battery backup units in the battery backup unit shelf. In certain embodiments, the power assist system operates at a busbar voltage below the battery backup units in a battery backup unit shelf.

In certain embodiments, power assist system discharge voltage thresholds are configurable to support different usage models. In certain embodiments, when the sensed voltage is between 51-50 Vdc, the power assist system is charging or operating in a standby mode of operation. In certain embodiments, when the sensed voltage is between 51-50 Vdc, a battery backup unit type power assist system, a power assist unit type power assist system, or a combination thereof, each charge or operate in a standby mode of operation. In certain embodiments, when the sensed voltage is between 50-48 Vdc, a power assist type power assist system provides assistance to a system power supply unit and discharges. In certain embodiments, when the sensed voltage is between 48-47 Vdc, a battery backup unit type power assist system, provides assistance to a power supply unit and discharges. In certain embodiments, the sensed voltage comprises a bus bar sensed voltage. In certain embodiments, when the sensed voltage is between 47 Vdc-46 Vdc, a power assist unit type power assist system, provides assistance to a power supply unit, a battery backup unit, or a combination thereof, and discharges. In certain embodiments, the sensed voltage comprises a bus bar sensed voltage.

In various embodiments, the power assist system advantageously decouples bulk capacitance from the power platform and power supply units to optimize energy density and power output. In various embodiments, the power assist system advantageously includes voltage sense with programmable trigger voltage thresholds to limit discharge to a target usage model. In various embodiments, the power assist system advantageously right sizes power supply unit capacity to a customer's configuration thereby allowing the power supply unit to operate at an optimal point of its efficiency curve, which is particularly important at light loads and in redundant power supply unit configurations. In various embodiments, the power assist system advantageously power supply unit configurations in which the power supply unit cost is proportional to output size.

In various embodiments, the power assist system advantageously facilitates configurations which are target market regulatory requirement compliant. In various embodiments the target market regulatory requirements can be geographic specific such as European Union regulatory requirements. In various embodiments, the power assist system advantageously facilitates power system configurations which are not over provisioned.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both of the other subsystems 108 or the network port 110 include power supply system 150 and power assist system 152, one or both of which are coupled to a power transmittal device 154. In certain embodiments, the power transmittal device 154 includes a rack busbar, a power bus of the server type information handling system, or a combination thereof. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the information handling system 100 includes a power assist system 152. In certain embodiments, the power assist system 152 provides a disaggregated power solution. In certain embodiments, the additional mechanical volume enabled by a disaggregated power solution can be extended to provide support for power assist units (PAU). In certain embodiments, the power assist units include an appreciation that power assist units can include bulk capacitors which charge from and discharge to the vertical rack busbar. In certain embodiments, the power assist units support multiple usage models including extended peak power support, filtering peak power events from the data center, extended ride through time, or extended holdup time when transitioning to a BBU for persistent memory usage models.

In certain embodiments, the power assist system 152 provides high output power capacitance via a power assist unit (PAU). In certain embodiments, the power assist unit includes a battery backup unit (BBU) type power assist unit which conforms to a battery backup unit form factor. In certain embodiments, the battery backup unit power assist unit is configured to be installed within a battery backup unit shelf of a server rack, a battery backup unit slot of a server type information handling system, or a combination thereof. In certain embodiments, the power assist unit includes a power supply unit (PSU) type power assist unit which conforms to a power supply unit form factor. In certain embodiments, the power supply unit power assist unit is configured to be installed within a power supply shelf of a server rack, a power supply slot of a server type information handling system, or a combination thereof. In certain embodiments, the power assist system 152 conforms with power supply unit shelf behavior, battery backup unit shelf behavior, or a combination thereof defined by a server rack specification. In certain embodiments, the server rack specification includes an open rack base specification such as the ORv3 base specification.

In certain embodiments, the power assist system 152 includes high voltage bulk capacitors such as those commonly found in power supply units. In certain embodiments, the power assist system 152 senses a busbar voltage. In certain embodiments, the power assist system 152 charges at nominal voltage via a boost controller. In certain embodiments, the power assist system 152 discharges when a system voltage droops. In certain embodiments, the power assist system 152 discharges via a buck controller. In certain embodiments, the buck controller controls a buck converter or a step down converter.

In certain embodiments, the power assist system 152 includes a switched discharge resistor. In certain embodiments, the switched discharge resistor facilitates draining of the charge on the bulk capacitors when the power assist system 152 is serviced. In certain embodiments, the power assist system 152 operates at a busbar voltage below the power supply units in the power shelf and above the battery backup units in the battery backup unit shelf. In certain embodiments, the power assist system 152 operates at a busbar voltage below the battery backup units in a battery backup unit shelf.

In certain embodiments, power assist system 152 discharge voltage thresholds are configurable to support different usage models. In certain embodiments, when the sensed voltage is between 51-50 Vdc, the power assist system 152 is charging or operating in a standby mode of operation. In certain embodiments, when the sensed voltage is between 51-50 Vdc, a battery backup unit type power assist system 152, a power assist unit type power assist system 152, or a combination thereof, each charge or operate in a standby mode of operation. In certain embodiments, when the sensed voltage is between 50-48 Vdc, a power assist type power assist system 152 provides assistance to a system power supply unit and discharges. In certain embodiments, when the sensed voltage is between 48-47 Vdc, a battery backup unit type power assist system 152, provides assistance to a power supply unit and discharges. In certain embodiments, the sensed voltage comprises a bus bar sensed voltage. In certain embodiments, when the sensed voltage is between 47 Vdc-46 Vdc, a power assist unit type power assist system 152, provides assistance to a power supply unit, a battery backup unit, or a combination thereof, and discharges. In certain embodiments, the sensed voltage comprises a bus bar sensed voltage.

Figure 2:
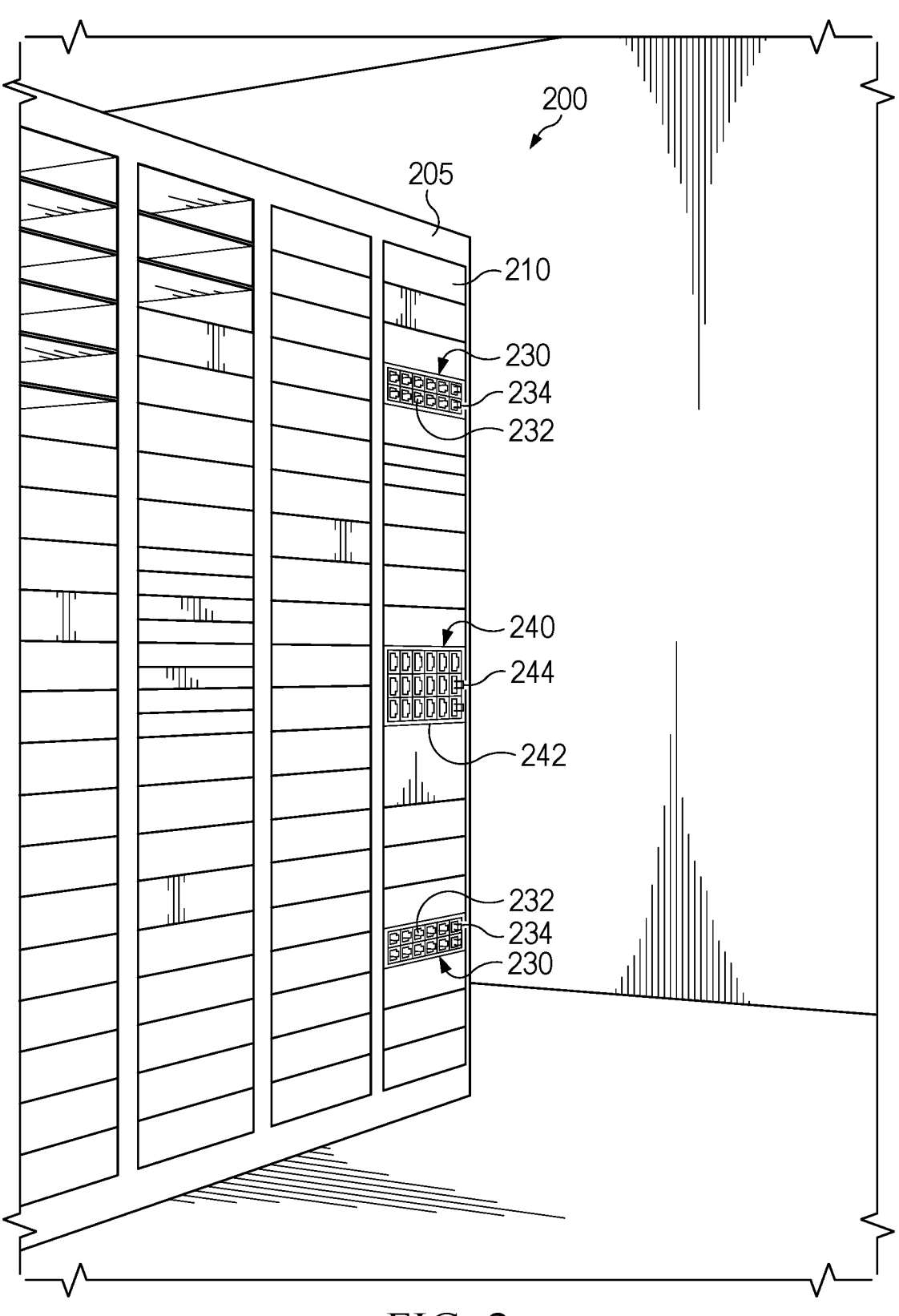
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4 U rack unit. In general, a 1 U rack unit is substantially (i.e., +/−20%) 1.75" high, a 2 U rack unit is substantially (i.e., +/−20%) 3.5" high and a 4 U rack height is substantially (i.e., +/−20%) 7.0" high.

In certain embodiments, a rack includes one or more rack power supply unit systems 230. In certain embodiments, each rack power supply unit system 230 is referred to as a power supply unit shelf. In certain embodiments, each rack power supply unit system 230 includes a plurality of respective power supply units 232. In certain embodiments, each rack power supply unit system 230 includes at least one power supply unit type power assist unit 234. In certain embodiments, each rack power supply unit system 230 includes a plurality of horizontally arranged power supply units 232 and at least one power supply unit type power assist unit 234. In certain embodiments, each rack power supply unit system 230 includes a plurality of rows of horizontally arranged power supply units 232 and power supply unit type power assist units 234. In certain embodiments, each power supply unit 230 and each power supply unit type power assist unit 234 is housed within a housing conforming to a power supply unit form factor. In certain embodiments, each rack power supply unit system 230 and each power supply unit type power assist units 234 is coupled to a busbar of the rack. In certain embodiments, the busbar provides power to other information handling systems contained within a respective rack.

In certain embodiments, a rack includes one or more rack battery backup unit systems 240. In certain embodiments, each rack battery backup unit system 240 is referred to as a battery backup unit shelf. In certain embodiments, each rack battery backup unit system 240 includes a plurality of respective battery backup units 242. In certain embodiments, each rack power supply unit system 230 includes at least battery backup type power assist unit 244. In certain embodiments, each rack battery backup unit system 240 includes a plurality of horizontally arranged battery backup units 242 and at least one battery backup type power assist unit 244. In certain embodiments, each rack battery backup unit system 240 includes a plurality of rows of horizontally arranged battery backup units 242 and battery backup type power assist units 244. In certain embodiments, each battery backup unit 240 and each battery backup type power assist unit 244 is housed within a housing conforming to a battery backup unit form factor. In certain embodiments, each rack battery backup unit system 240 and each battery backup type power assist unit 244 is coupled to a busbar of the rack. In certain embodiments, the busbar provides power to other information handling systems contained within a respective rack.

In certain embodiments, one or more racks include a disaggregated power distribution solution. In certain embodiments, one or more racks include a disaggregated power distribution solution which conforms to power standards which include data center rack busbar based power schemes (such as open compute project open rack standard). In certain embodiments, some information handling systems mounted within the rack include busbar clips for connecting the information handling system to the busbar of the rack.

Figure 3:
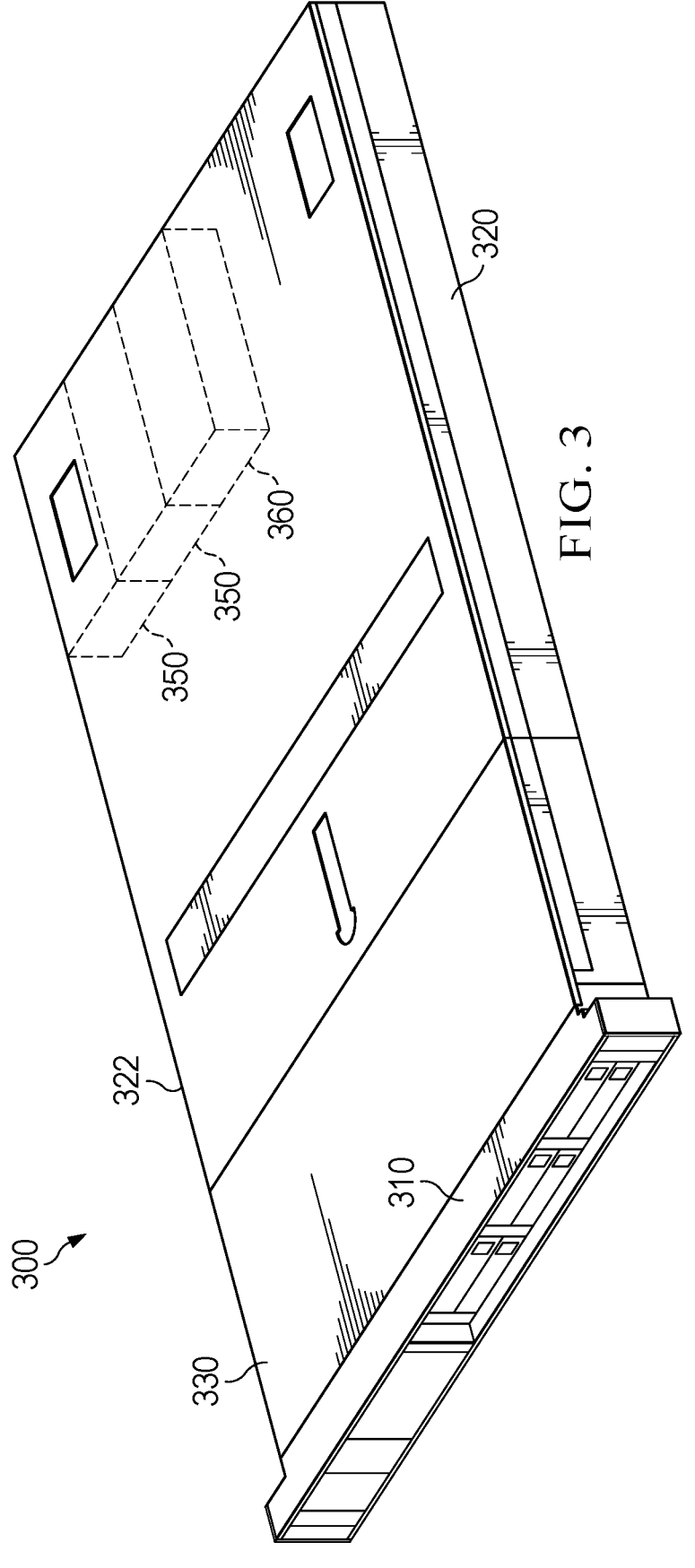
FIG. 3 shows a generalized perspective view of an example server type information handling system.

FIG. 3 shows a generalized perspective view of an example blade server type information handling system 300. In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the blade type information handling system 300 may be accessed by removing a top panel 330 of the blade type information handing system 300. In certain embodiments, the blade type information handing system 300 includes a bay 350 via which components may be mounted to the blade type information handling system.

In certain embodiments, the blade type information handling system 300 includes one or more power slots 350. In certain embodiments, the blade type information handling system 300 includes one or more power assist system slots 360. In certain embodiments, the power slots 350 are configured to receive a respective power supply unit, battery backup unit, or a combination thereof. In certain embodiments, the power assist system slots 360 are configured to receive a respective power assist system.

Figure 4:
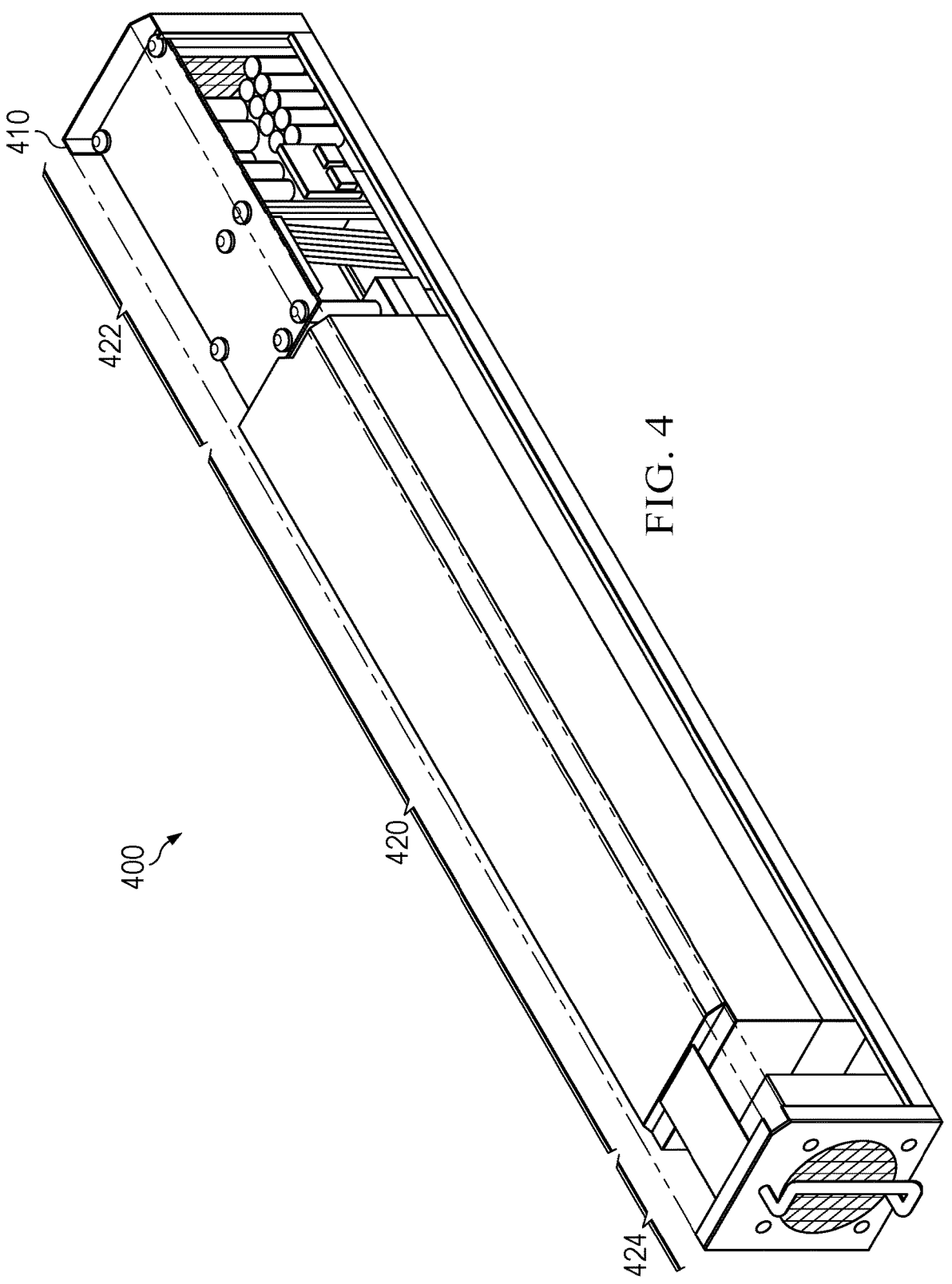
FIG. 4 shows a perspective view of a battery backup unit type power assist system for use with server type information handling system.

FIG. 4 shows a perspective view of a battery backup unit type power assist system 400 for use with server type information handling system. In certain embodiments, the battery backup power assist system 400 provides high output power via the battery backup power assist system 400. In certain embodiments, the battery backup unit (BBU) type power assist unit which conforms to a battery backup unit form factor. In certain embodiments, the battery backup unit power assist unit 400 is configured to be installed within a battery backup unit shelf of a server rack, a battery backup unit slot of a server type information handling system, or a combination thereof.

In certain embodiments, the battery backup power assist system 400 includes a battery backup power assist system housing 410, In certain embodiments, the battery backup power assist system housing 410 conforms to a battery backup unit form factor.

In certain embodiments, the battery backup power assist system housing 410 includes a power assist battery portion 420, a controller 422 (also referred to as a power assist system controller) and a fan 424. In certain embodiments, the controller 422 includes a DC-DC converter. In certain embodiments, the power assist battery portion 420 corresponds to a power assist system power portion. In certain embodiments, the controller 422 is configured to couple the battery backup power assist system 400 with a rack busbar. In certain embodiments, the controller 422 is configured to couple the battery backup power assist system 400 with a power bus of a server type information handling system. In certain embodiments, the rack busbar, the power bus of the server type information handling system, or a combination thereof provide a power transmittal device.

Figure 5:
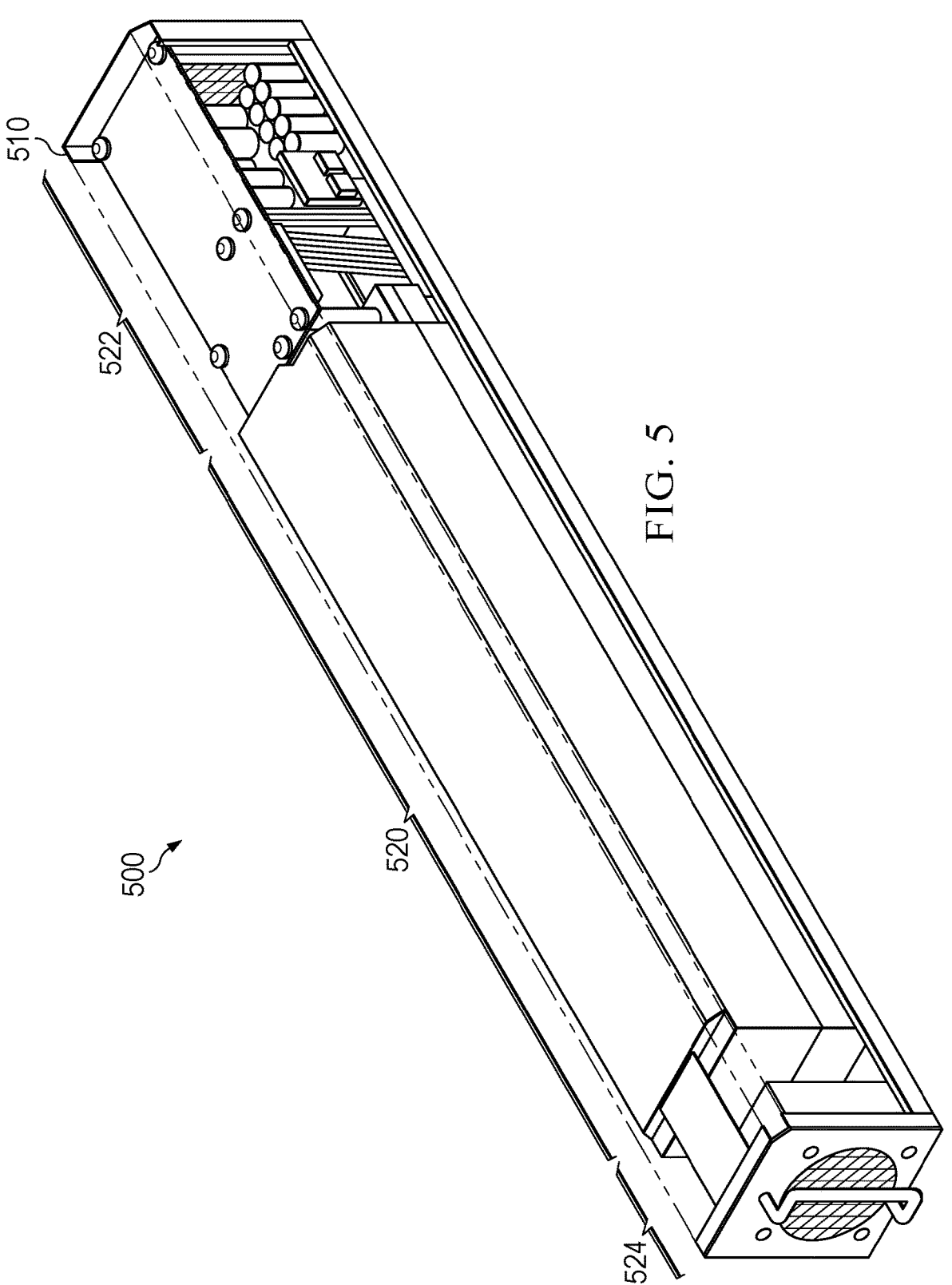
FIG. 5 shows a perspective view of a power supply unit type power assist system for use with server type information handling system.

FIG. 5 shows a perspective view of a power supply unit type power assist system 500 for use with server type information handling system. In certain embodiments, the power supply unit type power assist system 500 provides high output capacitance via the power supply unit type power assist system 500. In certain embodiments, the power supply unit type power assist system 500 conforms to a battery backup unit form factor. In certain embodiments, the power supply unit type power assist system 500 is configured to be installed within a power supply unit shelf of a server rack, a power supply unit slot of a server type information handling system, or a combination thereof.

In certain embodiments, the power supply unit type power assist system 500 includes a power supply unit type power assist system housing 510, In certain embodiments, the power supply unit type power assist system housing 510 conforms to a power supply unit form factor.

In certain embodiments, the power supply unit power assist system housing 510 includes a power assist capacitor portion 520, a controller 522 (also referred to as a power assist system controller) and a fan 524. In certain embodiments, the controller 522 includes a DC-DC converter. In certain embodiments, the power assist capacitor portion 520 corresponds to a power assist system power portion. In certain embodiments, the controller 522 is configured to couple the power supply unit power assist system 500 with a rack busbar. In certain embodiments, the controller 522 is configured to couple the power supply unit power assist system 500 with a power bus of a server type information handling system. In certain embodiments, the rack busbar, the power bus of the server type information handling system, or a combination thereof provide a power transmittal device.

Figure 6:
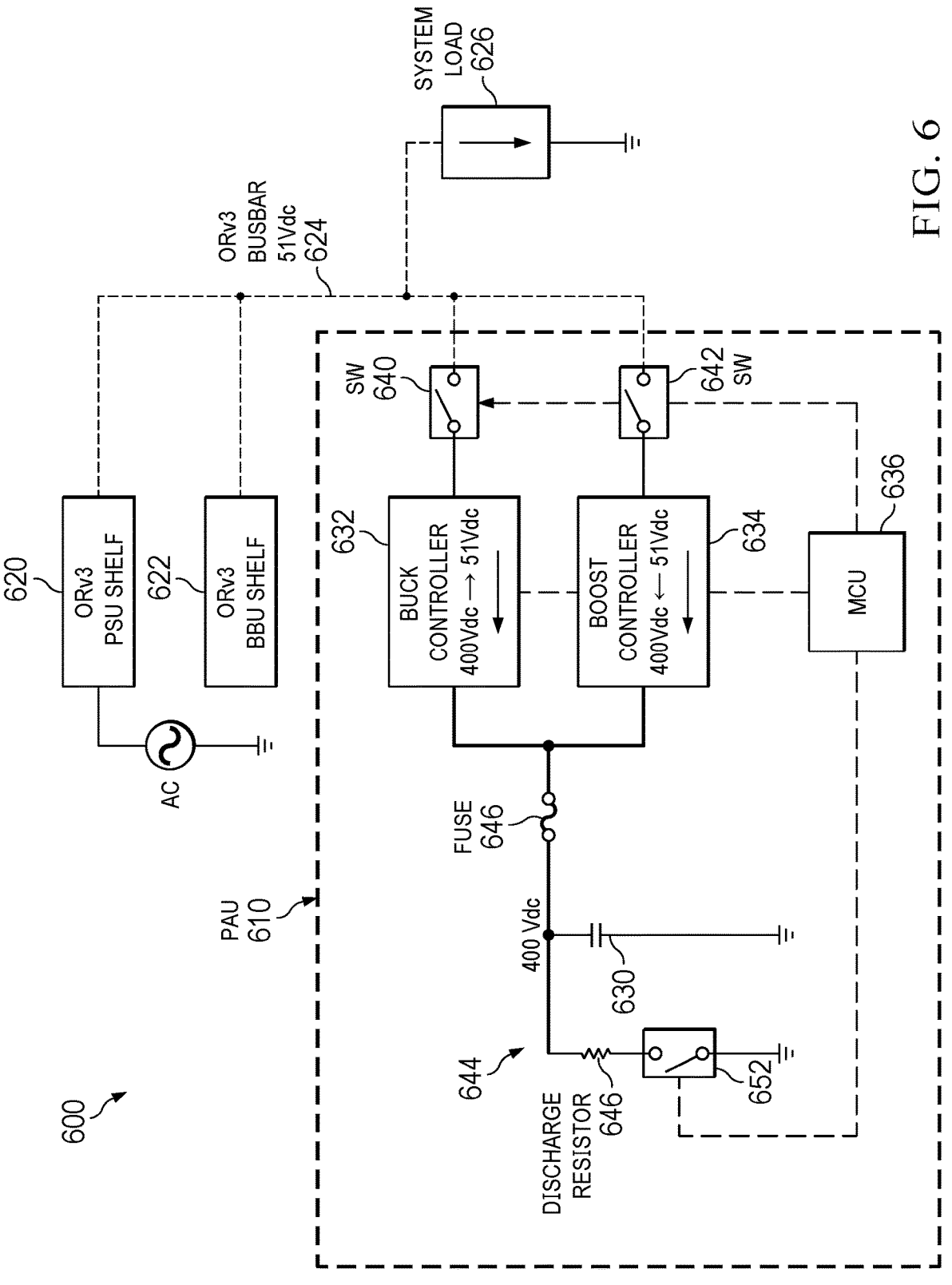
FIG. 6 shows a schematic view of a power assist system.

FIG. 6 shows a schematic view of a power assist system environment 600. More specifically, the power assist system environment 600 includes a power assist unit system 610. In certain embodiments, the power assist system environment 600 includes a power supply unit shelf 620, a battery backup unit shelf 622, a busbar 624, a system load 626, or a combination thereof. In certain embodiments, the power supply unit shelf 620 is coupled to a power source such as an alternating current (AC) power source. In certain embodiments, the power supply unit shelf 620 conforms to a server rack power standard. In certain embodiments, the server rack power standard corresponds to an open rack base specification such as the ORv3 base specification. In certain embodiments, the battery backup unit shelf 620 conforms to a server rack power standard. In certain embodiments, the server rack power standard corresponds to an open rack base specification such as the ORv3 base specification.

In certain embodiments, the power assist system 610 includes a capacitor circuit 630, a buck controller circuit 632, a boost controller circuit 634, a micro control unit 636, a buck controller switch 640, a boost controller switch 642, a discharge circuit 644, a fuse circuit 646, or a combination thereof. In certain embodiments, the discharge circuit 644 includes a discharge resistor 650, a discharge switch 652, or a combination thereof.

In certain embodiments, the capacitor circuit 630 includes high voltage bulk capacitors such as those commonly found in power supply units. In certain embodiments, the power assist system 610 senses a busbar voltage. In certain embodiments, the power assist system 610 charges at nominal voltage via the boost controller circuit 634. In certain embodiments, the power assist system 610 discharges a system load when a system voltage droops via the buck controller 632. In certain embodiments, the power assist system 610 discharges the system load via the buck controller circuit 632. In certain embodiments, the buck controller circuit 632 includes a buck converter or a step down converter.

In certain embodiments, the discharge circuit 644 of the power assist system 610 includes a switched discharge resistor. In certain embodiments, the switched discharge resistor facilitates draining of the charge on the bulk capacitors when the power assist system 610 is serviced. In certain embodiments, the power assist system 610 operates at a busbar voltage below the power supply units in the power shelf and above the battery backup units in the battery backup unit shelf. In certain embodiments, the power assist system 610 operates at a busbar voltage below the battery backup units in a battery backup unit shelf.

In certain embodiments, the power assist system 610 operates at a busbar voltage below the power supply units in the power shelf and above the battery backup units in the battery backup unit shelf. In certain embodiments, power assist system 610 discharge voltage thresholds are configurable to support different usage models.

In certain embodiments, when the sensed voltage is between 51-50 Vdc, the power assist system 610 is charging or operating in a standby mode of operation. In certain embodiments, when the sensed voltage is between 51-50 Vdc, a battery backup unit type power assist system 610, a power assist unit type power assist system 610, or a combination thereof, each charge or operate in a standby mode of operation. In certain embodiments, when the sensed voltage is between 50-48 Vdc, a power assist type power assist system 610 provides assistance to a system power supply unit and discharges. In certain embodiments, when the sensed voltage is between 48-47 Vdc, a battery backup unit type power assist system 610, provides assistance to a power supply unit and discharges. In certain embodiments, the sensed voltage comprises a bus bar sensed voltage. In certain embodiments, when the sensed voltage is between 47 Vdc-46 Vdc, a power assist unit type power assist system 610, provides assistance to a power supply unit, a battery backup unit, or a combination thereof, and discharges. In certain embodiments, the sensed voltage comprises a bus bar sensed voltage.

In certain embodiments, the power assist system 610 operates at a busbar voltage below the battery backup units in a battery backup unit shelf. In certain embodiments, power assist system 610 discharge voltage thresholds are configurable to support different usage models. In certain embodiments, when the sensed voltage is between 51-48 Vdc, power assist unit type power assist system, the battery backup unit type power assist system 610, or a combination thereof are charging or operating in a standby mode of operation. In certain embodiments, when the sensed voltage is between 48-47 Vdc, a battery backup unit type power assist system 610 discharges and provides assistance to a power supply unit. In certain embodiments, when the sensed voltage is between 47 Vdc-46 Vdc, a power assist unit type power assist system 610, provides assistance to a power supply unit, a battery backup unit, or a combination thereof, and discharges. In certain embodiments, the sensed voltage comprises a bus bar sensed voltage.

In certain embodiments, the capacitor 630 may be replaced with a battery to provide a battery backup unit type power assist system.

Figure 7:
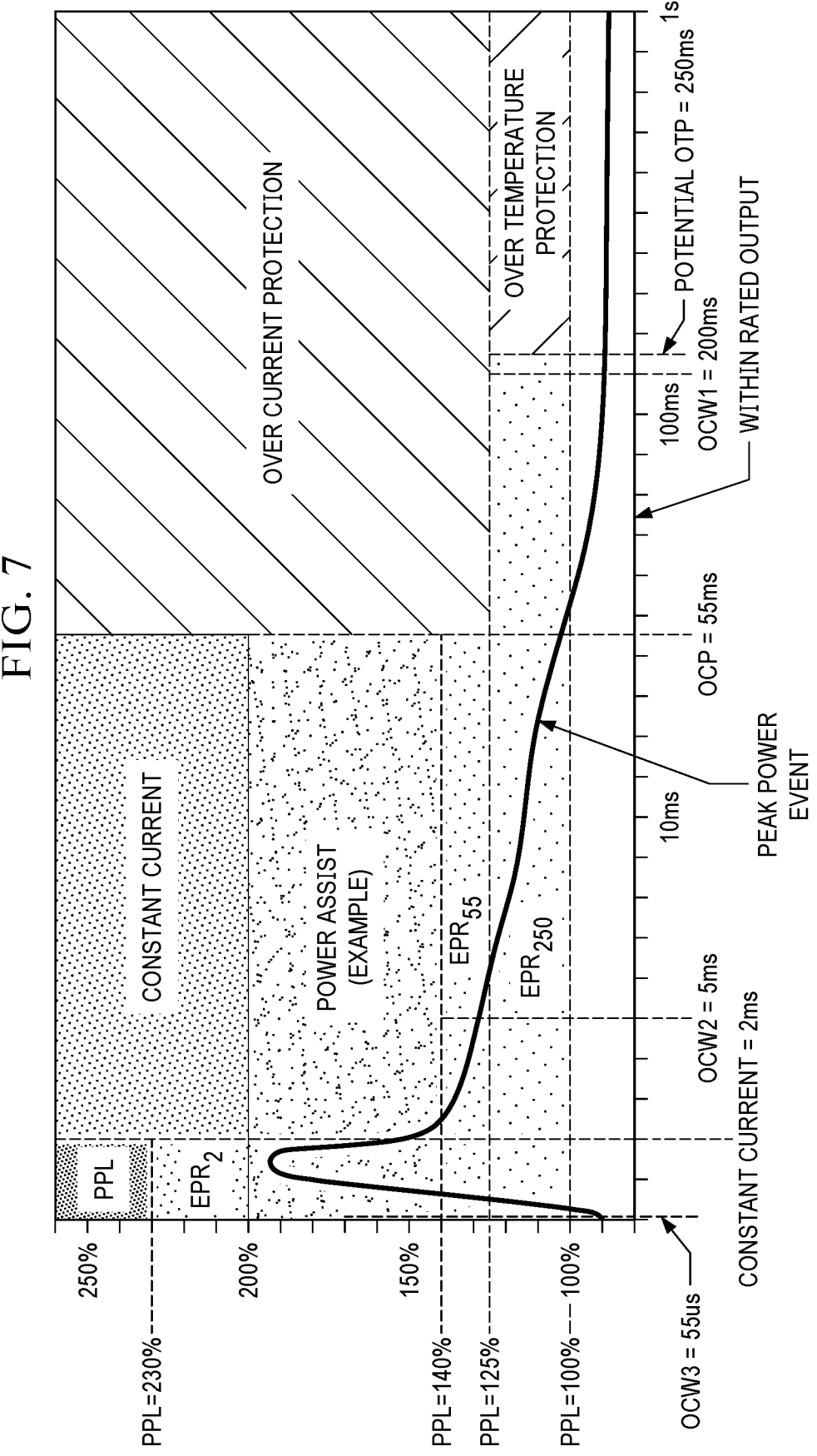
FIG. 7 shows a diagrammatic view of power operation of a power assist system.

FIG. 7 shows a diagrammatic view of power operation of a power assist system. As shown in FIG. 7, when a peak power event occurs, providing an information handling system, a rack, or a combination thereof, with a power assist system addresses the issue of power transients without impacting system performance or requiring an over provi-sioned power system.

More specifically, the power supply unit power assist unit provides extended power range (EPR) which enables ride-through of short duration power transients of peak power events without impacting performance. In certain embodi-ments, the power supply unit extended power range is protected by over-current warning detection that triggers system hardware throttling.

The present invention is well adapted to attain the advan-tages mentioned as well as others inherent therein. While the present invention has been depicted, described, and is defined by reference to particular embodiments of the inven-tion, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A power assist system, comprising:
a power assist system housing, the power assist housing conforming to a power supply unit form factor, the power assist system housing fitting within a mechanical volume enabled by a disaggregated power solution;
a power assist system power portion contained within the power assist system housing; and,
a power assist system controller contained within the power assist system housing, the power assist system controller coupling the power assist system to a power transmittal device, the power assist system controller includes a buck controller circuit and a boost controller circuit, the boost controller circuit of the power assist system controller charging the power assist system power portion at a nominal voltage, the buck controller circuit of the power assist system controller providing power from the power assist system power portion to the power transmittal device during a peak power event.

2. The power assist system of claim 1, wherein:
the power assist system comprises a battery backup power assist system.

3. The power assist system of claim 2, wherein:
the power assist system housing conforms to a battery backup unit form factor.

4. The power assist system of claim 1, wherein:
the power assist system comprises a power supply unit power assist system.

5. The power assist system of claim 1, wherein:
the power assist system housing-is configured to be installed within at least one of a power supply unit shelf of a server rack and a power supply unit slot of a server type information handling system; and,
the power supply unit slot of the server type information handling system conforms to the power supply unit form factor.

6. The power assist system of claim 1, wherein:
the power transmittal device comprises an information handling system power bus, a server rack busbar, or a combination thereof.

7. A system comprising:
a processor;
a data bus coupled to the processor; and
a power assist system, the power assist system comprising
a power assist system housing, the power assist housing conforming to a power supply unit form factor, the power assist system housing fitting within a mechanical volume enabled by a disaggregated power solution;
a power assist system power portion contained within the power assist system housing; and,
a power assist system controller contained within the power assist system housing, the power assist system controller coupling the power assist system to a power transmittal device, the power assist system controller includes a buck controller circuit and a boost controller circuit, the boost controller circuit of the power assist system controller charging the power assist system power portion at a nominal voltage, the buck controller circuit of the power assist system controller providing power from the power assist system power portion to the power transmittal device during a peak power event.

8. The system of claim 7, wherein:
the power assist system comprises a battery backup power assist system.

9. The system of claim 8, wherein:
the power assist system housing conforms to a battery backup unit form factor.

10. The system of claim 7, wherein:
the power assist system comprises a power supply unit power assist system.

11. The system of claim 10, further comprising:
the power assist system housing is configured to be installed within at least one of a power supply unit shelf of a server rack and a power supply unit slot of a server type information handling system; and,
the power supply unit slot of the server type information handling system conforms to-the power supply unit form factor.

12. The system of claim 7, wherein:
the power transmittal device comprises an information handling system power bus, a server rack busbar, or a combination thereof.

13. A server rack system comprising:
a server rack;
a system installed on the server rack, the system com-prising
a processor,
a data bus coupled to the processor; and,
a power assist system installed on the server rack, the power assist system comprising
a power assist system housing, the power assist housing conforming to a power supply unit form factor, the power assist system housing fitting within a mechanical volume enabled by a disaggregated power solution;

a power assist system power portion contained within the power assist system housing; and, a power assist system controller contained within the power assist system housing, the power assist system controller coupling the power assist system to a power transmittal device, the power assist system controller includes a buck controller circuit and a boost controller circuit, the boost controller circuit of the power assist system controller charging the power assist system power portion at a nominal voltage, the buck controller circuit of the power assist system controller providing power from the power assist system power portion to the power transmittal device during a peak power event.

14. The server rack system of claim 13, wherein:

the power assist system comprises a battery backup power assist system.

15. The server rack system of claim 14, wherein:

the power assist system housing conforms to a battery backup unit form factor.

16. The server rack system of claim 13, wherein:

the power assist system comprises a power supply unit power assist system.

17. The server rack system of claim 13, wherein:

the power assist system housing-is configured to be installed within at least one of a power supply unit shelf of a server rack and a power supply unit slot of a server type information handling system; and, the power supply unit slot of the server type information handling system conforms to the power supply unit form factor.

18. The server rack system of claim13, wherein:

the power transmittal device comprises an information handling system power bus, a server rack busbar, or a combination thereof.

\* \* \* \* \*